United States Patent
Seo et al.

(10) Patent No.: US 8,071,422 B2
(45) Date of Patent: Dec. 6, 2011

(54) METHOD OF FABRICATING THIN FILM TRANSISTOR INCLUDING ORGANIC SEMICONDUCTOR LAYER AND SUBSTRATE

(75) Inventors: Hyun-Sik Seo, Annyang-si (KR);
Seung-Han Paek, Incheon (KR);
Kyoung-Mook Lee, Seoul (KR);
Dae-Hyun Nam, Goyang-si (KR);
Nack-Bong Choi, Suwon-si (KR);
Sung-Hwan Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 75 days.

(21) Appl. No.: 11/455,754

(22) Filed: Jun. 20, 2006

(65) Prior Publication Data

US 2007/0155045 A1 Jul. 5, 2007

(30) Foreign Application Priority Data

Dec. 20, 2005 (KR) .................. 10-2005-0126247

(51) Int. Cl.
*H01L 51/40* (2006.01)
(52) U.S. Cl. ..... 438/99; 438/149; 257/40; 257/E51.005; 257/E29.151; 349/132
(58) Field of Classification Search .............. 438/99, 438/149, 151; 257/40, 98, E51.005, E29.151; 349/132, 135
See application file for complete search history.

(56) References Cited

U.S. PATENT DOCUMENTS

| | | | |
|---|---|---|---|
| 6,939,665 B2* | 9/2005 | Ishida et al. | 430/311 |
| 2005/0274954 A1* | 12/2005 | Tanaka et al. | 257/72 |
| 2006/0145145 A1* | 7/2006 | Nishio | 257/40 |
| 2007/0275498 A1* | 11/2007 | Beecher et al. | 438/99 |

FOREIGN PATENT DOCUMENTS

| | | | |
|---|---|---|---|
| EP | 1357612 | | 10/2003 |
| JP | 2003-282599 | | 10/2003 |
| JP | 2005-246344 | | 9/2005 |
| KR | 10-2004-0012212 | * | 2/2004 |
| WO | WO 2005045939 | | 5/2005 |

OTHER PUBLICATIONS

Korean Patent English Abstracts, (KR Pub. No. 10-2004-0012212), Jun, Seung IK "Method of Fabricating Thin Film Transistor" (Nov. 2, 2004).*
Seung-Ik Jeon "Method for fabricating thin film transistor", KR Application No. 10-2002-0045655 (Feb. 11, 2004), Machine English Translation.*
JP Publication 06-118413 "Orientation Method For Liquid Crystal Molecule", Yamazoe Hiroshi (Apr. 28, 1994).*

* cited by examiner

*Primary Examiner* — Khiem D Nguyen
(74) *Attorney, Agent, or Firm* — McKenna Long & Aldridge LLP

(57) ABSTRACT

Disclosed is a display device including a thin film transistor. A method for forming the display device includes forming an organic semiconductor pattern in the presence of a magnetic field or an electric field. Due to the presence of a magnetic field or an electric field, the molecules of the organic semiconductor layer of the thin film transistor are substantially aligned in a predetermined direction.

18 Claims, 8 Drawing Sheets

METHOD OF FABRICATING THIN FILM TRANSISTOR INCLUDING ORGANIC SEMICONDUCTOR LAYER AND SUBSTRATE

This application claims the benefit of Korean Patent Application No. P2005-0126247, filed on Dec. 20, 2005, which is hereby incorporated by reference for all purposes as if fully set forth herein.

BACKGROUND OF THE INVENTION

1. Field of the Invention

The present invention relates to a display device and method for fabricating the same, and more particularly, to a display device including a thin film transistor and method for fabricating the same that includes an organic semiconductor layer.

2. Discussion of the Related Art

Until recently, display devices have typically used cathode-ray tubes (CRTs). Much effort has been made to study and develop various types of flat panel displays, such as liquid crystal display (LCD) devices, plasma display panels (PDPs), field emission displays (FED), and electro-luminescence displays (ELDs), as a substitute for CRTs. In particular, these types of flat panel displays are an active matrix type display in which a plurality of pixels arranged in a matrix form are driven by a plurality of thin film transistors therein. Among the active matrix types of flat panel displays, liquid crystal display (LCD) devices and electroluminescent display (ELD) devices are widely used as monitors for notebook computers and desktop computers because of their high resolution, ability to display colors and superiority in displaying moving images.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field in the direction of the induced electric field, thereby changing the light transmissivity of the LCD device. Thus, the LCD device displays images by varying the intensity of the induced electric field.

FIG. 1 is a perspective view of an LCD device according to the related art. As illustrated in FIG. 1, the LCD device includes a lower substrate 10, an upper substrate 20 and a liquid crystal material 30. The lower substrate 10 is referred to as an array substrate that includes a gate line 14 and a data line 16 crossing each other to define a pixel region "P". A pixel electrode 18 and a thin film transistor "T", which is a switching element, are positioned in each pixel region "P". Thin film transistors "T" located adjacent to the crossings of the gate lines 14 and the data lines 16 are disposed in a matrix on the lower substrate 10. The upper substrate 20 is referred to as a color filter substrate that includes color filter patterns 26 including red (R), green (G) and blue (B) color filter patterns 26a, 26b and 26c, respectively, a black matrix 25 between the color filter patterns 26, and a common electrode 28 on both the color filter pattern 26 and the black matrix 25.

In the above related art LCD device, a hard type substrate such as a glass substrate has been used for the upper and lower substrates. In light of the fact that small-size portable display devices such as personal digital assistants (PDA) and notebook computers are presently widely used, much effort has been made to study and develop a flexible substrate such as a plastic substrate having a low weight and good flexibility. However, because fabricating the array substrate including the thin film transistors requires a high temperature of more than 200 centigrade degrees, it is difficult to use a flexible substrate for the array substrate. Accordingly, a flexible substrate is used for the color filter substrate and a hard type substrate is used for the array substrate.

In general, electrodes and lines made of a metallic material, an insulating layer, a passivation layer and the like on the array substrate can be formed at a temperature equal to or less than 200 centigrade degrees. However, when a semiconductor layer made of amorphous silicon or poly-crystalline silicon is formed at a temperature equal to or less than 200 degrees centigrade, the electrical properties of the thin film transistors on the array substrate including electric conductivity are degraded so that the thin film transistors may not function as a switching element.

To overcome the above problems, an effort is also being made to study and develop a method for fabricating a thin film transistor and an array substrate at a low temperature equal to or less than 200 centigrade degrees by using an organic semiconductor material.

The organic semiconductor material is categorized into a low molecular weight organic semiconductor material and a high molecular weight organic semiconductor material. The low molecular weight organic semiconductor material has properties better than the high molecular weight organic semiconductor material. However, because the low molecular weight organic semiconductor material is affected by a solvent such as alcohol, it is difficult to make an organic solution having the low molecular weight organic semiconductor material. Accordingly, it is difficult to use a coating method, which is easier than an evaporation method, for forming an organic semiconductor layer. Also, when the low molecular weight semiconductor layer is exposed to an etching solution including an organic solvent during a patterning process, the properties of the low molecular weight semiconductor layer are degraded.

The high molecular weight organic semiconductor material is not affected by the organic solvent and may be patterned easily. However, the properties of the high molecular weight organic semiconductor layer is not comparable to the low molecular weight organic semiconductor layer.

FIG. 2 is a cross-sectional view illustrating a molecular arrangement in a low molecular weight semiconductor layer according to the related art.

As illustrated in FIG. 2, the molecules 62 of the low molecular weight organic semiconductor layer 60 are randomly deposited by an evaporation method. Because the long axes of the molecules 62 of the low molecular weight organic semiconductor layer 60 are randomly arranged, the low molecular weight organic semiconductor layer 60 has poor properties.

Meanwhile, a high molecular weight organic semiconductor layer may be formed by a coating method. However, because the long axes of the molecules of the high molecular weight organic semiconductor layer formed by a coating method are randomly arranged, the high molecular weight organic semiconductor layer also has poor properties.

To improve such poor properties, a SAM (self aligned mono-layer) method is added during the fabricating method. For example, in the case of a bottom contact structure where the organic semiconductor layer made of the high or low molecular weight organic semiconductor material is disposed on source and drain electrodes, an OTS (octadecyltrichlorosilane) treatment and a MNB (2-mercapto-5-nitrobenzidazole) treatment are performed as part of the SAM method. The OTS treatment is performed to improve an interface property of the organic semiconductor layer and a gate insulating layer below the organic semiconductor layer, prior to forming the organic semiconductor layer. The MNB treatment is performed to improve an ohmic contact property of the organic semiconductor layer and the source and drain electrodes.

However, because the SAM method is susceptible to moisture and temperature, the electrical properties of the thin film transistors may not be uniform, thereby reducing the reliability of the array substrate. Also, the added SAM method increases the fabrication costs and time and decreases the productivity.

SUMMARY OF THE INVENTION

Accordingly, the present invention is directed to a display device including a thin film transistor and method for fabricating the same that substantially obviates one or more of the problems due to limitations and disadvantages of the related art.

An advantage of the present invention is to provide a display device including a thin film transistor and method for fabricating the same that can improve productivity.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a display device including a thin film transistor includes forming a gate electrode on a substrate; forming a gate insulating layer on the gate electrode; forming source and drain electrodes on the gate insulating layer; forming an organic semiconductor pattern contacting the source and drain electrodes in the presence of a magnetic field or an electric field.

In another aspect of the present invention, a method of fabricating a display device including a thin film transistor includes forming an organic semiconductor pattern on a substrate in the presence of either a magnetic field or an electric field; forming a gate insulating layer on the organic semiconductor pattern; forming a gate electrode on the gate insulating layer; forming an interlayer insulating film on the gate electrode, the interlayer insulating film having first and second contact holes exposing both side portions of the organic semiconductor pattern; and forming source and drain electrodes contacting the both side portions through the first and second contact holes, respectively.

In yet another aspect of the present invention, a display device includes a thin film transistor, wherein a semiconductor layer of the thin film transistor includes an organic material and molecules of the semiconductor layer are substantially aligned in a predetermined direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to embodiments of the present invention, examples of which are illustrated in the accompanying drawings.

Figure 1:
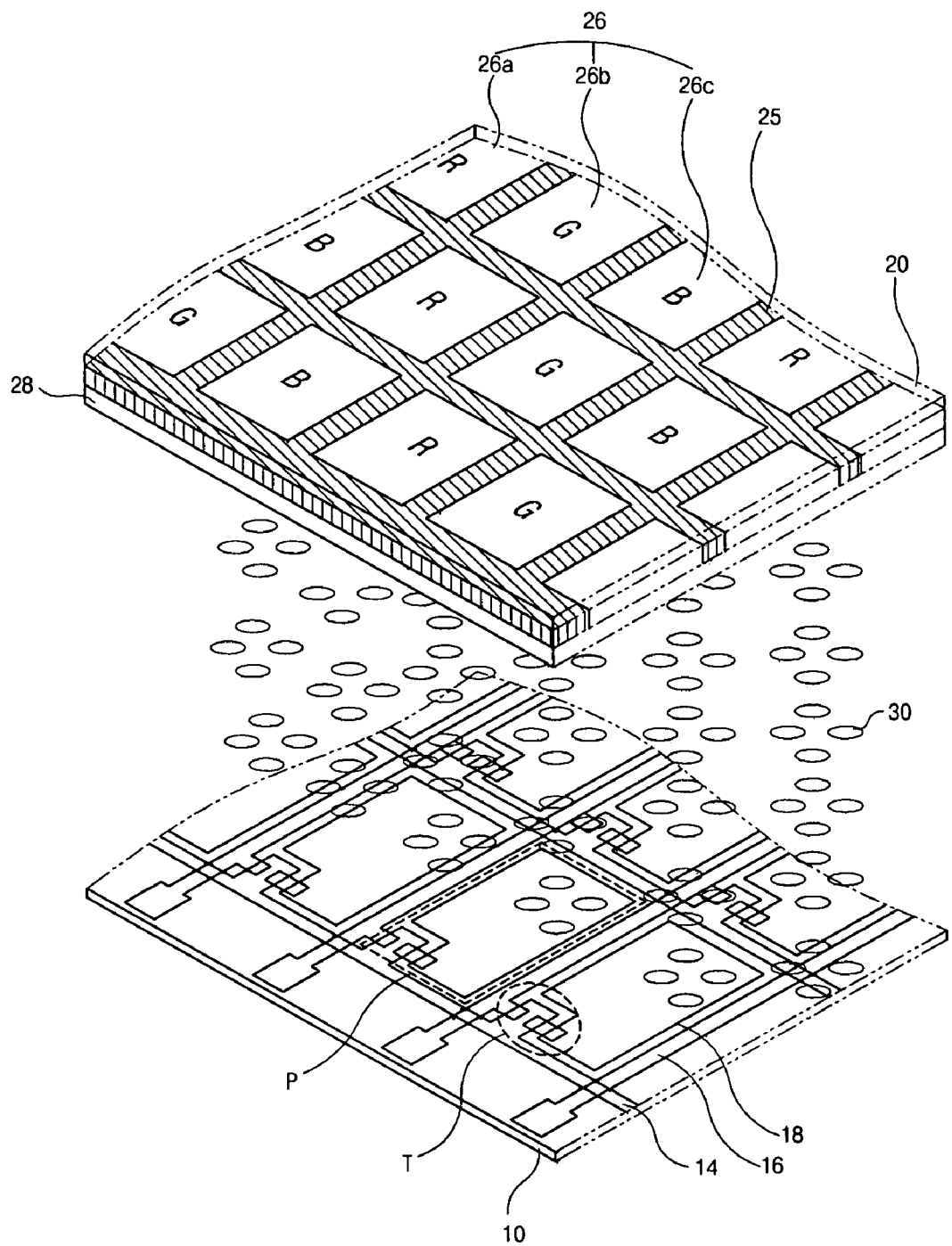
FIG. 1 is a perspective view of an LCD device according to the related art.
Figure 2:
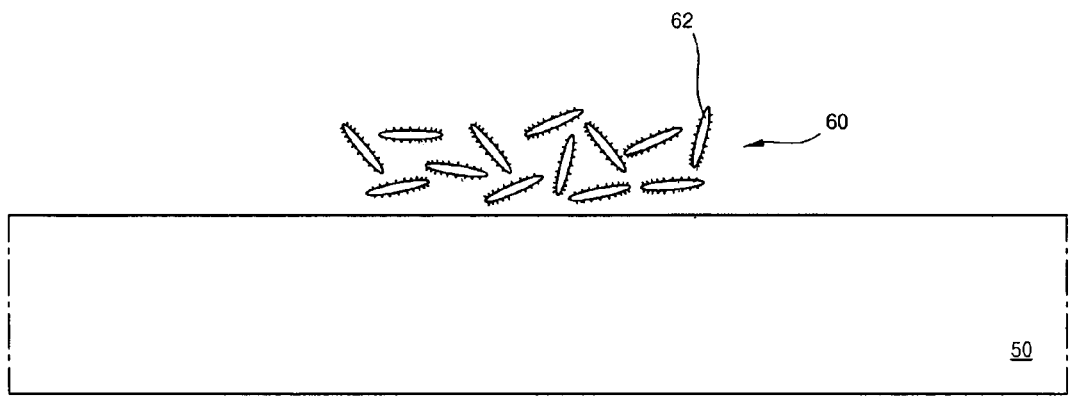
FIG. 2 is a cross-sectional view illustrating a molecular arrangement in a low molecular weight semiconductor layer according to the related art.
Figure 3A:
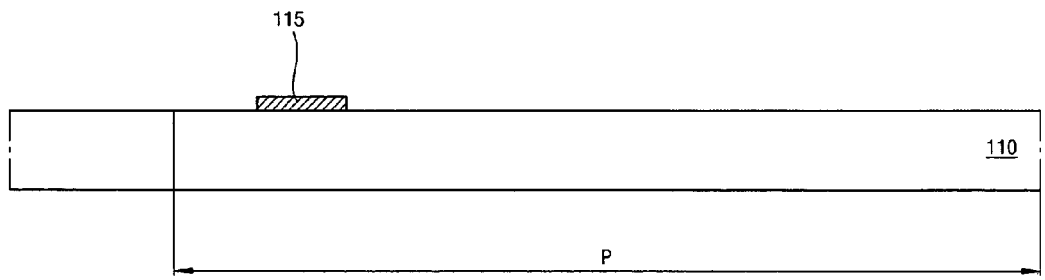
FIGS. 3A to 3F are cross-sectional views of a method for fabricating an array substrate including a thin film transistor using an organic semiconductor material according to a first embodiment of the present invention.
Figure 3B:
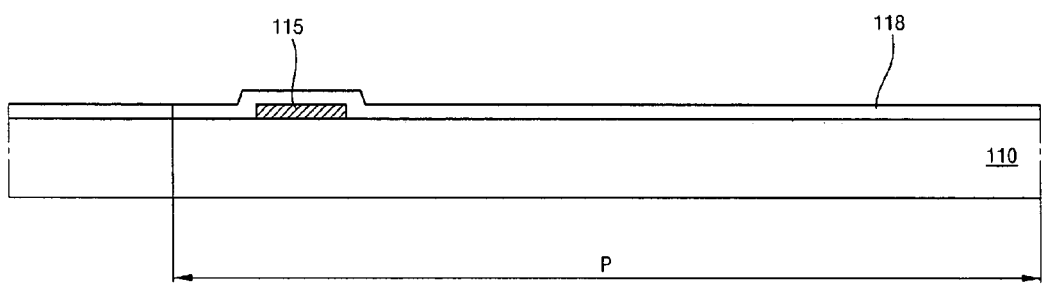
Figure 3C:
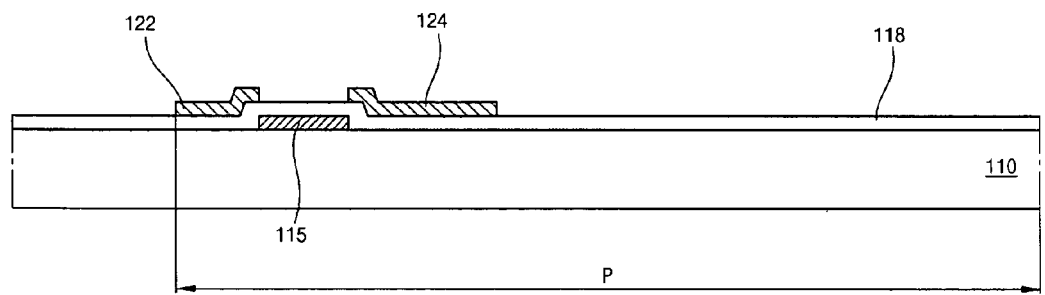
Figure 3D:
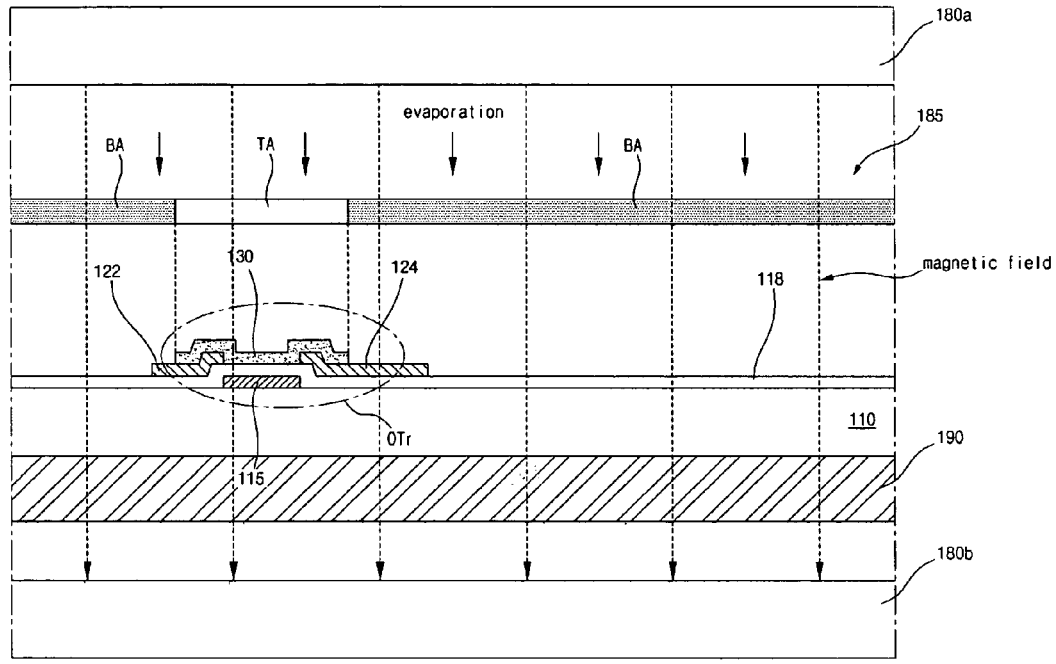
Figure 3E:
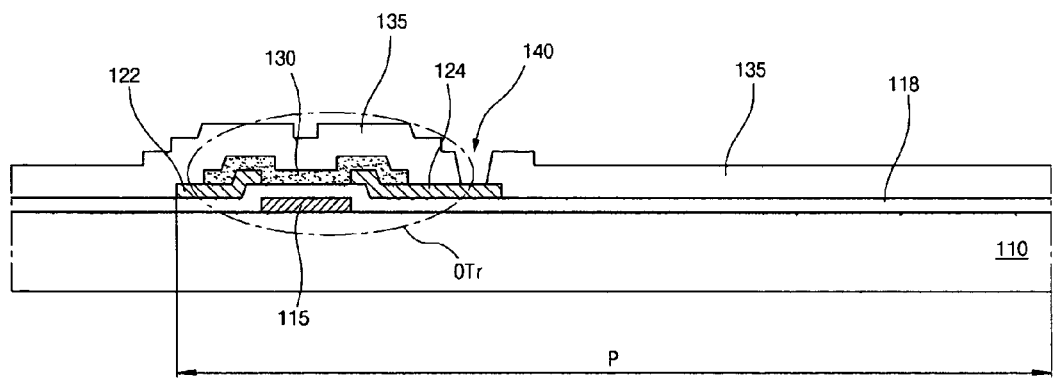
Figure 3F:
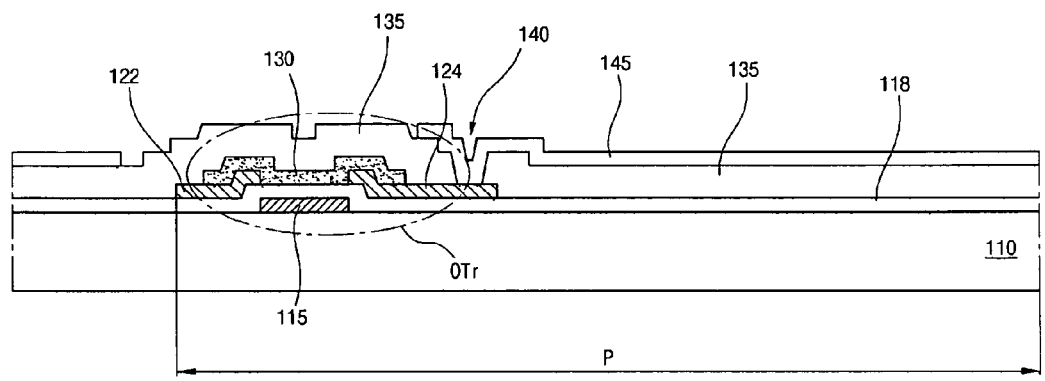
Figure 4:
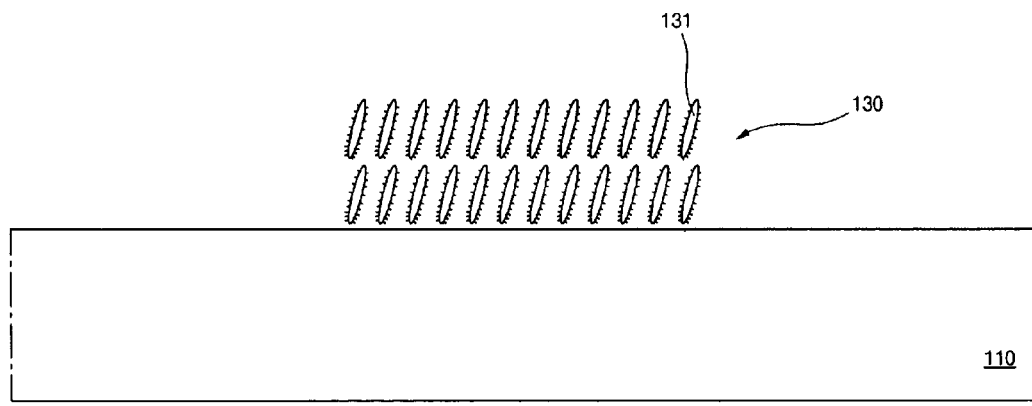
FIG. 4 is a cross-sectional view illustrating a molecular arrangement in an organic semiconductor layer according to the first embodiment of the present invention.

FIGS. 3A to 3F are cross-sectional views of a method for fabricating an array substrate including a thin film transistor using an organic semiconductor material according to a first embodiment of the present invention, and FIG. 4 is a cross-sectional view illustrating a molecular arrangement in an organic semiconductor layer according to the first embodiment of the present invention. The first embodiment relates to a thin film transistor using a low molecular weight organic semiconductor material.

Referring to FIG. 3A, a first metallic material is deposited on a substrate 110 and patterned to form a gate electrode 115 and a gate line (not shown). The substrate 110 may be a flexible type substrate such as a plastic substrate or a hard type substrate such as a glass substrate. The first metallic material may be deposited by a sputtering method at a temperature equal to or less than 200 centigrade degrees. A photolithography process, including photoresist-depositing, light-exposing and developing, is performed on the deposited metallic material, and then the deposited metallic material is etched and the photoresist is stripped, thereby forming the gate electrode 115. A process including the photolithography process, the etching process and the stripping process is referred to as a mask process.

Referring to FIG. 3B, a gate insulating layer 118 is formed on the entire substrate 110 having the gate electrode 115 and the gate line (not shown) at a temperature equal to or less than 200 centigrade degrees. The gate insulating layer 118 includes at least one inorganic insulating material such as silicon oxide ($SiO_2$) or silicon nitride (SiNx), or at least one organic insulating material such as poly-vinyl-alcohol (PVA) or polyimide.

Referring to FIG. 3C, a second metallic material is deposited on the gate insulating layer 118 by a sputtering method. The second metallic material includes one of gold (Au), indium-tin-oxide (ITO), nickel (Ni), lead (Pb), aluminum (Al), tantalum (Ta), titanium (Ti) and the like having a good contact property with an organic semiconductor material.

An organic conductive material such as PEDOT:PSS (poly ethylene dioxy thiophene: poly styrene sulfonate) may be further coated on the second metallic material. The above process is performed at a temperature equal to or less than 200 centigrade degrees. Then, the second metallic material or both the second metallic material and the organic conductive material are patterned to form source and drain electrodes 122 and 124 and a data line (not shown). The data line crosses the gate line to define a pixel region P.

Referring to FIG. 3D, the substrate 110 having the source and drain electrodes 122 and 124 and the data line is moved into a chamber of an evaporation apparatus and is placed on a stage 190. The evaporation apparatus includes a magnetic field generator having first and second magnetic poles 180a and 180b. The first and second magnetic poles 180a and 180b are disposed at the top and bottom of the chamber, respectively, such that a magnetic field generated by the two magnetic poles 180a and 180b is applied to the substrate 110 between the two magnetic poles 180a and 180b. A direction of the magnetic field may be constant or be alternated during an evaporation process. To generate the magnetic field, a permanent-magnet or an electromagnet may be used as the magnetic poles 180a and 180b. An angle of the magnetic field with respect to the surface of the substrate 110 may be adjusted according to an arrangement direction of the organic semiconductor molecules. For example, the angle of the magnetic field may be 90 degrees or a slanted angle. To make the slanted angle, the stage 190 may be rotated relative to the magnetic field. The magnetic field may have an intensity of about 20 G to 100 G.

While the magnetic field is applied, a low molecular weight organic semiconductor material is evaporated and deposited on the substrate 110 having the source and drain electrodes 122 and 124 and the data line to form an organic semiconductor layer 130. Accordingly, the molecules 131 of the low molecular weight organic semiconductor layer 130 are arranged in a predetermined direction in accordance with a direction and intensity of the magnetic field, as illustrated in FIG. 4.

To form the organic semiconductor layer 130 at a desired position, a shadow mask 185 is used when the low molecular weight organic semiconductor material is evaporated and deposited. The shadow mask 185 includes a blocking portion BA and a transmitting portion TA. The blocking portion BA of the shadow mask 185 prevents the evaporated low molecular weight organic semiconductor material from being deposited at an undesirable position. Beneficially, the organic semiconductor layer 130 substantially fills the space between the source and drain electrodes 122 and 124 and overlaps at least a part of the source and drain electrodes 122 and 124. The low molecular weight organic semiconductor material is evaporated at a temperature equal to or less than 200 centigrade degrees. A heater or electron-beam may be used to evaporate the low molecular weight organic semiconductor material.

Alternatively, a patterning method may be used to form the organic semiconductor layer 130, instead of directly depositing the low molecular weight organic semiconductor material with the shadow mask 180. For example, after the low molecular weight organic semiconductor material is evaporated and deposited on the entire substrate 110 in the presence of a magnetic field, poly-vinyl-alcohol (PVA) is coated on the organic semiconductor layer and the PVA layer is exposed to light and developed using a developing solution such as a DI (deionized) water to thereby form a PVA pattern. Then, the organic semiconductor layer is dry-etched using the PVA pattern to form the organic semiconductor layer 130. At this time, the PVA pattern may remain on the organic semiconductor layer 130.

As explained above, a magnetic field is applied to arrange the molecules of the low molecular weight organic semiconductor layer. However, it should be understood that an electric field may be applied to arrange the molecules of the low molecular weight organic semiconductor layer. To apply an electric field, an electric field generator having a similar structure to the structure of the magnetic field generator in FIG. 3D may be used. In other words, first and second electrodes are disposed at the top and bottom, respectively, such that the electric field generated by the two electrodes is applied to the substrate 110 between the two electrodes. A direction of the electric field may be constant or be alternated during an evaporation process. An angle of the electric field with respect to the surface of the substrate 110 may be adjusted according to an arrangement direction of the organic semiconductor molecules. For example, the angle of the electric field may be 90 degrees or a slanted angle. To make the slanted angle, the stage 190 may be rotated relative to the electric field.

With the processes described above, an organic thin film transistor OTr having the gate electrode 115, the source and drain electrodes 122 and 124 and the organic semiconductor layer 130 is formed.

Referring to FIG. 3E, a passivation layer 135 is formed on the substrate 110 having the organic semiconductor layer 130 at a temperature equal to or less than 200 centigrade degrees. When the organic semiconductor layer 130 is formed by the patterning method, the passivation layer 135 may be formed on the PVA pattern. The passivation layer 135 includes at least one inorganic insulating material such as silicon oxide ($SiO_2$) or silicon nitride (SiNx), or at least one organic insulating material such as poly-vinyl-alcohol (PVA) or polyimide. Then, the passivation layer 135 is patterned to form a drain contact hole 140 exposing the drain electrode 124.

Referring to FIG. 3F, a transparent conductive material is deposited on the passivation layer 135 and patterned to form a pixel electrode 145 in the pixel region P. The pixel electrode 145 contacts the drain electrode 124 through the drain contact hole 140. The transparent conductive material includes indim-tin-oxide (ITO), indium-zinc-oxide (IZO), indium-tin-zinc-oxide (ITZO) or the like.

With the processes described above, an array substrate for an LCD device according to the first embodiment of the present invention is fabricated.

As described above, the organic semiconductor layer is formed in the presence of either a magnetic field or an electric field to arrange the molecules of the low molecular weight organic semiconductor layer in a predetermined direction. Accordingly, the molecules of the low molecular weight organic semiconductor layer can be easily arranged during the formation of the organic semiconductor layer without adding the processes of the SAM method, thereby increasing reliability and productivity.

In the first embodiment, a bottom contact structure of OTr is mainly explained in which the organic semiconductor layer is disposed on the source and drain electrodes. However, it should be understood that the principles of the first embodiment are applicable to a top contact structure of OTr in which the source and drain electrodes are disposed on the organic semiconductor layer. A difference between the bottom contact structure and the top contact structure is an order of forming the organic semiconductor layer and forming the source and drain electrodes. In other words, in the top contact structure, the source and drain electrodes are formed after forming the organic semiconductor layer.

Further, in the first embodiment, a staggered structure of OTr is mainly explained. However, it should be understood that the principles of the first embodiment is applicable to a coplanar structure of OTr. Also, in the first embodiment, a low molecular weight organic semiconductor material is mainly explained. However, it should be understood that the principles of the first embodiment is applicable to a high molecular weight organic semiconductor material.

FIGS. 5A to 5G are cross-sectional views of a method for fabricating an array substrate including a thin film transistor using an organic semiconductor material according to a second embodiment of the present invention. The second embodiment relates to a thin film transistor using a high molecular weight organic semiconductor material.

Figure 5A:
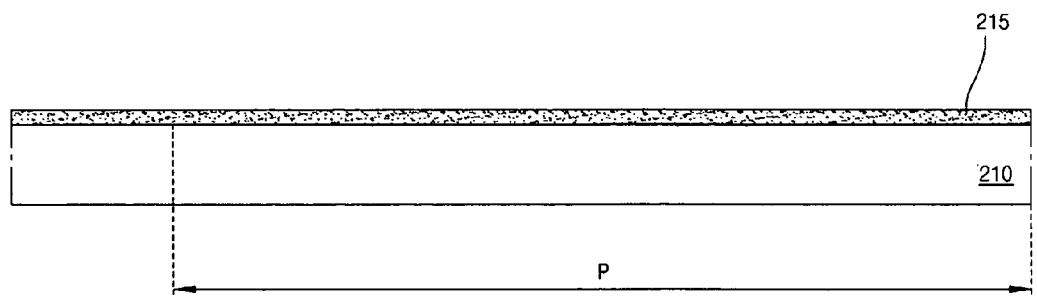
FIGS. 5A to 5G are cross-sectional views of a method for fabricating an array substrate including a thin film transistor using an organic semiconductor material according to a second embodiment of the present invention.

Referring to FIG. 5A, a high molecular weight organic semiconductor material is coated on a substrate 210 to form an organic semiconductor layer 215. The high molecular weight organic semiconductor material may be coated by a spin coating method or slit coating method. The substrate 210 may be a flexible type substrate such as a plastic substrate or a hard type substrate such as a glass substrate.

Figure 5B:
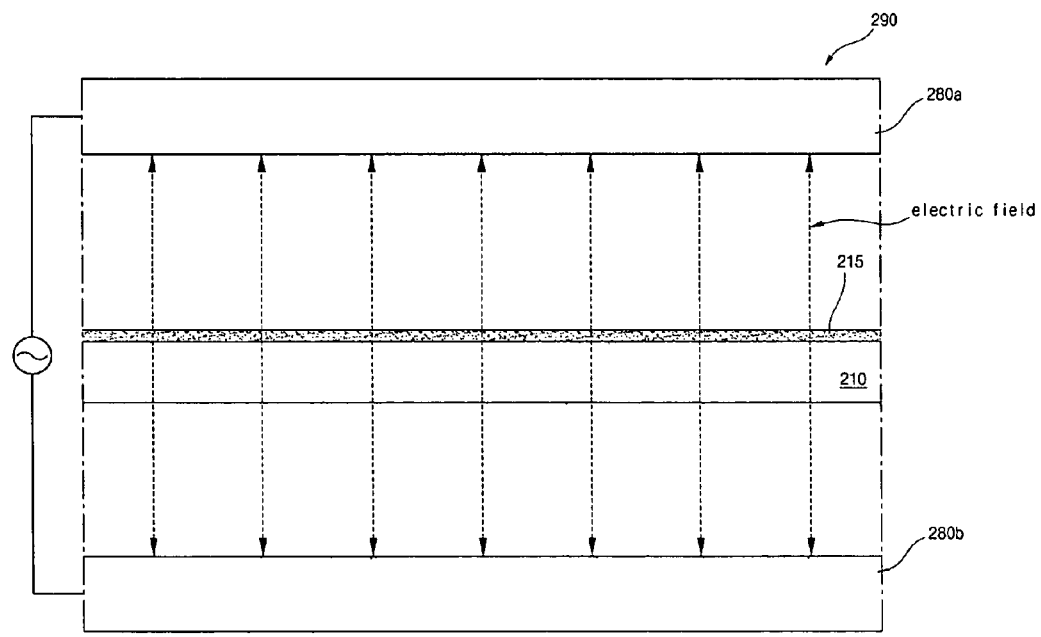

Referring to FIG. 5B, the organic semiconductor layer 215 is moved into a chamber 290 of a heating apparatus such as a furnace and an oven to be cured. Through the curing process, a solvent in the organic semiconductor layer 215 is removed and the organic semiconductor layer 215 is cured. The curing process is performed at a temperature equal to or less than 200 centigrade degrees.

The heating apparatus includes a magnetic field generator or an electric field generator similar to the evaporation apparatus of the first embodiment. Because the magnetic field generator and the electric field generator are explained in the first embodiment, detailed explanations thereof are omitted. For convenience, an electric field generator is used to describe the second embodiment.

The electric field generated from the electric field generator arranges the molecules of the high molecular weight organic semiconductor layer 215 in a predetermined direction. High and low voltages may be alternately applied to each of first and second electrodes 280a and 280b, and thus a direction of the electric field periodically may change. The molecules of the high molecular weight organic semiconductor layer 215 are exposed to the electric field before polymerization. Accordingly, the molecules of the high molecular weight organic semiconductor layer 215 are arranged in a predetermined direction due to polarization of the molecules of the high molecular weight organic semiconductor layer 215. Then, when polymerizing the molecules of the high molecular weight organic semiconductor layer 215, a chain length of the polymerized molecules is shortened due to the one-direction alignment of the molecules of the high molecular weight organic semiconductor layer 215. Therefore, charges can move smoothly along the well-arranged chains, and thus the electrical properties of OTr can be improved.

Figure 5C:
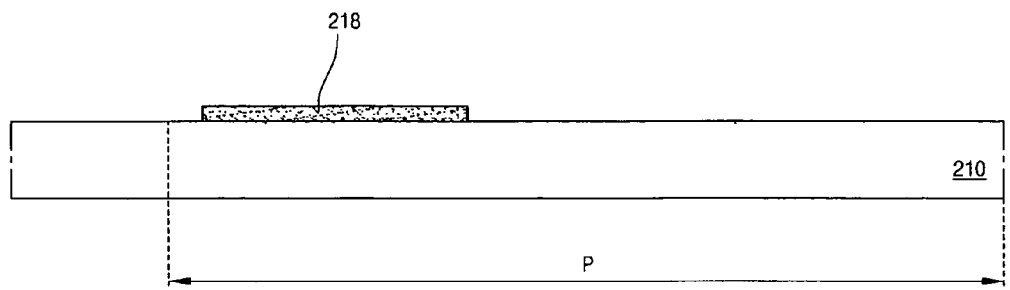

Referring to FIG. 5C, the organic semiconductor layer (215 of FIG. 5B) is patterned to form an organic semiconductor pattern 218.

Figure 5D:
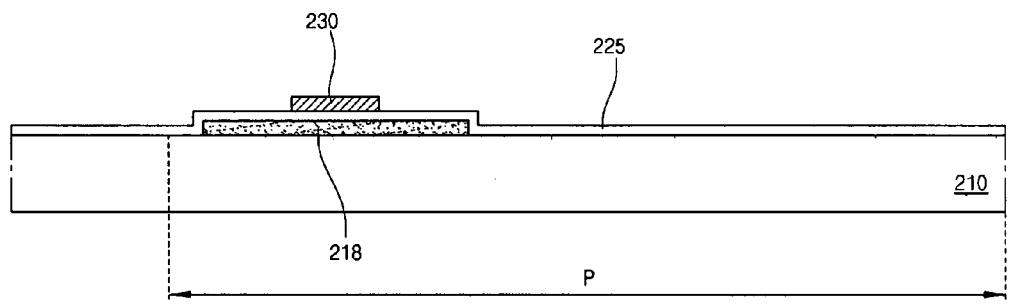

Referring to FIG. 5D, a gate insulating layer 225 is formed on the entire substrate 210 having the organic semiconductor pattern 218 at a temperature equal to or less than 200 centigrade degrees. The gate insulating layer 225 includes at least one inorganic insulating material such as silicon oxide ($SiO_2$) or silicon nitride (SiNx), or at least one organic insulating material such as poly-vinyl-alcohol (PVA) or polyimide.

Then, a first metallic material is deposited on the gate insulating layer 225 and patterned to form a gate electrode 230 and a gate line (not shown). The first metallic material may be deposited by a sputtering method at a temperature equal to or less than 200 centigrade degrees.

Figure 5E:
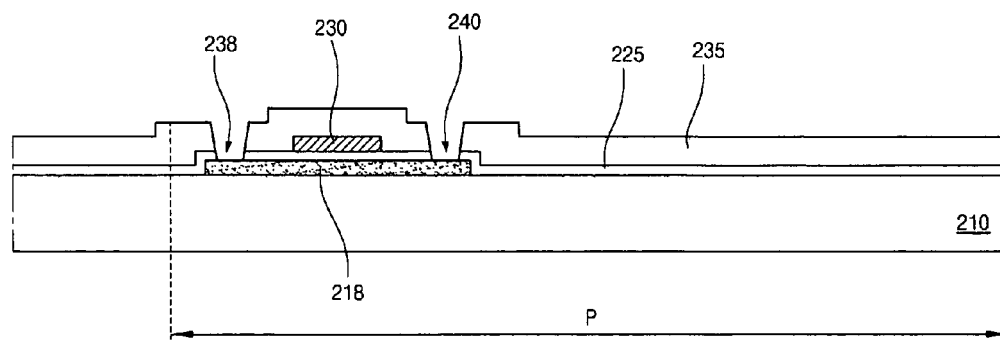

Referring to FIG. 5E, an interlayer insulating film 235 is formed on the substrate 210 having the gate electrode 230 and the gate line at a temperature equal to or less than 200 centigrade degrees. The interlayer insulating film 235 includes at least one inorganic insulating material such as silicon oxide ($SiO_2$) or silicon nitride (SiNx), or at least one organic insulating material such as poly-vinyl-alcohol (PVA) or polyimide. Then, the interlayer insulating film 235 and the gate insulating layer 225 are patterned to form first and second contact holes 238 and 240 exposing both side portions of the organic semiconductor pattern 218.

Figure 5F:
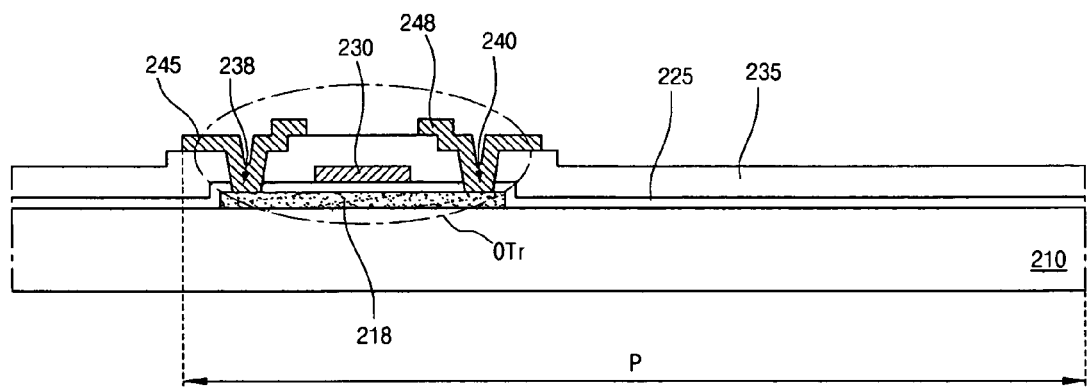

Referring to FIG. 5F, a second metallic material is deposited on the interlayer insulating film 235 by a sputtering method. The second metallic material includes one of gold (Au), indium-tin-oxide (ITO), nickel (Ni), lead (Pb), aluminum (Al), tantalum (Ta), titanium (Ti) and the like having a good contact property with the organic semiconductor material.

An organic conductive material such as PEDOT:PSS (poly ethylene dioxy thiophene:poly styrene sufonate) may be coated on the second metallic material. This process is performed at a temperature equal to or less than 200 degrees centigrade. Then, the second metallic material or both the second metallic material and the organic conductive material is patterned to form source and drain electrodes 245 and 248 and a data line (not shown). The data line crosses the gate line to define a pixel region P. The source and drain electrodes 245 and 248 contact both side portions of the organic semiconductor pattern 218 through the first and second contact holes 238 and 240, respectively.

With the processes described above, an organic thin film transistor OTr having the gate electrode 230, the organic semiconductor pattern 218 and the source and drain electrodes 245 and 248 is formed.

Figure 5G:
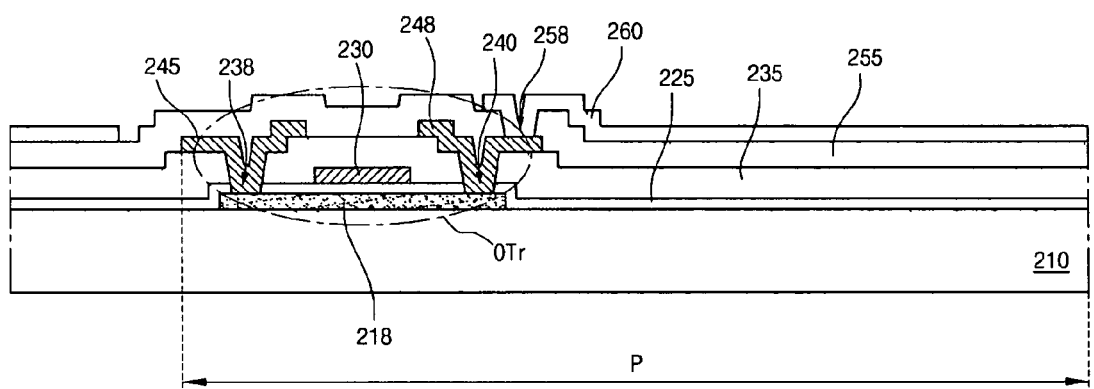

Referring to FIG. 5G, a passivation layer 255 is formed on the substrate 210 having the source and drain electrodes 245 and 248 at a temperature equal to or less than 200 centigrade degrees. The passivation layer 255 includes at least one inorganic insulating material such as silicon oxide ($SiO_2$) or silicon nitride (SiNx), or at least one organic insulating material such as poly-vinyl-alcohol (PVA) or polyimide. Then, the passivation layer 255 is patterned to form a drain contact hole 258 exposing the drain electrode 248.

Then, a transparent conductive material is deposited on the passivation layer 255 and patterned to form a pixel electrode 260 in the pixel region. The pixel electrode 260 contacts the drain electrode 248 through the drain contact hole 258. The transparent conductive material includes indium-tin-oxide (ITO), indium-zinc-oxide (IZO), indium-tin-zinc-oxide (ITZO) or the like.

With the processes described above, an array substrate for an LCD device according to the second embodiment of the present invention is fabricated.

As described above, the organic semiconductor layer is formed in the presence of either a magnetic field or an electric field to arrange the molecules of the high molecular weight organic semiconductor layer in a predetermined direction. Accordingly, the molecules of the high molecular weight organic semiconductor layer can be easily arranged during the formation of the organic semiconductor layer without adding the processes of the SAM method, thereby increasing reliability and productivity.

In the second embodiment, a coplanar structure of OTr is mainly explained. However, it should be understood that the principles of the second embodiment are applicable to a staggered structure of OTr as in the first embodiment. Also, in the second embodiment, a high molecular weight organic semiconductor material is mainly explained. However, it should be understood that the principles of the second embodiment is applicable to a low molecular weight organic semiconductor material.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a display device including a thin film transistor, comprising:
    forming a gate electrode on a substrate;
    forming a gate insulating layer on the gate electrode;
    forming source and drain electrodes on the gate insulating layer;
    forming an organic semiconductor pattern contacting the source and drain electrodes in the presence of a magnetic field or an electric field,
    wherein an angle of the magnetic field or the electric field with respect to a top surface of the substrate is 90 degrees or a slanted angle, and
    wherein a direction of the magnetic field or the electric field is alternated.

2. The method according to claim 1, wherein forming the organic semiconductor pattern includes evaporating an organic semiconductor material in the presence of the magnetic field or the electric field using a shadow mask.

3. The method according to claim 1, wherein forming the organic semiconductor pattern includes:
    evaporating an organic semiconductor material in the presence of the magnetic field or the electric field;
    coating poly-vinyl-alcohol on the evaporated organic semiconductor material;
    patterning the coated poly-vinyl-alcohol; and
    etching the evaporated organic semiconductor material using the patterned poly-vinyl-alcohol.

4. The method according to claim 1, wherein the organic semiconductor pattern is formed on the source and drain electrodes.

5. The method according to claim 4, wherein the organic semiconductor pattern substantially fills the space between the source and drain electrodes and overlaps at least portions of the source and drain electrodes.

6. The method according to claim 1, wherein the organic semiconductor pattern includes a low molecular weight organic semiconductor material.

7. The method according to claim 1, wherein the magnetic field has an intensity of about 20 G to 100 G.

8. The method according to claim 1, wherein the substrate is a flexible type substrate.

9. The method according to claim 1, wherein the organic semiconductor pattern is formed at a temperature equal to or less than 200 centigrade degrees.

10. The method according to claim 1, wherein an organic conductive material is formed on the source and drain electrodes.

11. The method according to claim 1 further comprising:
    forming a passivation layer on the organic semiconductor pattern, the passivation layer having a drain contact hole exposing the drain electrode; and
    forming a pixel electrode on the passivation layer, the pixel electrode contacting the drain electrode through the drain contact hole.

12. A method of fabricating a display device including a thin film transistor, comprising:
    forming an organic semiconductor pattern on a substrate in the presence of either a magnetic field or an electric field, wherein an angle of the magnetic field or the electric field with respect to a top surface of the substrate is 90 degrees or a slanted angle;
    forming a gate insulating layer on the organic semiconductor pattern;
    forming a gate electrode on the gate insulating layer;
    forming an interlayer insulating film on the gate electrode, the interlayer insulating film having first and second contact holes exposing both side portions of the organic semiconductor pattern; and
    forming source and drain electrodes contacting the both side portions through the first and second contact holes, respectively,
    wherein forming the organic semiconductor pattern includes:
    coating an organic semiconductor material; and
    curing the coated organic semiconductor material in the presence of the magnetic field or the electric field after coating the organic semiconductor material; and
    patterning the cured organic semiconductor material,
    wherein a direction of the magnetic field or the electric field is alternated.

13. The method according to claim 12, wherein the magnetic field has an intensity of about 20 G to 100 G.

14. The method according to claim 12, wherein the organic semiconductor pattern includes a high molecular weight organic semiconductor material.

15. The method according to claim 12, wherein the substrate is a flexible type substrate.

16. The method according to claim 12, wherein the organic semiconductor pattern is formed at a temperature equal to or less than 200 centigrade degrees.

17. The method according to claim 12, wherein an organic conductive material is formed on the source and drain electrodes.

18. The method according to claim 12 further comprising:
    forming a passivation layer on the source and drain electrodes, the passivation layer having a drain contact hole exposing the drain electrode; and
    forming a pixel electrode on the passivation layer, the pixel electrode contacting the drain electrode through the drain contact hole.

* * * * *